US008222811B2

(12) United States Patent
Vaufrey et al.

(10) Patent No.: US 8,222,811 B2
(45) Date of Patent: Jul. 17, 2012

(54) ELECTROLUMINESCENT DISPLAY, ILLUMINATION OR INDICATING DEVICE, AND ITS FABRICATION PROCESS

(75) Inventors: David Vaufrey, Grenoble (FR); Tony Maindron, Grenoble (FR)

(73) Assignee: Commissariat a l'Energie Atomique et aux Energies Alternatives (FR)

( * ) Notice: Subject to any disclaimer, the term of this patent is extended or adjusted under 35 U.S.C. 154(b) by 0 days.

(21) Appl. No.: 13/001,874

(22) PCT Filed: Jun. 26, 2009

(86) PCT No.: PCT/FR2009/000798
§ 371 (c)(1),
(2), (4) Date: Mar. 21, 2011

(87) PCT Pub. No.: WO2010/004124
PCT Pub. Date: Jan. 14, 2010

(65) Prior Publication Data
US 2011/0186871 A1   Aug. 4, 2011

(30) Foreign Application Priority Data
Jul. 7, 2008   (FR) .................. 08 03841

(51) Int. Cl.
*H05B 33/04* (2006.01)

(52) U.S. Cl. .......... 313/512; 313/498; 313/506; 257/99; 257/100; 257/704; 438/26; 438/28

(58) Field of Classification Search ............ 313/512, 313/498, 506, 499, 500, 502; 257/99, 100, 257/704; 438/26, 28
See application file for complete search history.

(56) References Cited

U.S. PATENT DOCUMENTS

| 5,739,545 | A | 4/1998 | Guha et al. |
| 5,952,778 | A | 9/1999 | Haskal et al. |
| 8,030,841 | B2 * | 10/2011 | Kwack et al. ............... 313/504 |
| 2003/0143319 | A1 | 7/2003 | Park et al. |
| 2004/0099862 | A1 | 5/2004 | Suzuki et al. |
| 2007/0114925 | A1 * | 5/2007 | Cok ........................ 313/512 |
| 2007/0172971 | A1 | 7/2007 | Boroson |

FOREIGN PATENT DOCUMENTS
WO   WO 2005/071771   8/2005

OTHER PUBLICATIONS
International Search Report for International Application No. PCT/FR2009/000798.

* cited by examiner

*Primary Examiner* — Michael Shingleton
(74) *Attorney, Agent, or Firm* — Alston & Bird LLP

(57) ABSTRACT

The invention relates to an electroluminescent display, illumination or indicating device and to its fabrication process. This device (1) comprises a substrate (2) coated with an electroluminescent unit (3) having two electrodes, namely an internal electrode (5) and an external electrode (6), between which a light-emitting structure (4) is placed, at least one of said electrodes being transparent to the emitted light, a protective plate (7) being assembled on the unit by means of an adhesive (7*a*). According to the invention, this adhesive covers an adhesion-promoter layer (10) which surmounts the unit, being deposited by ALD (atomic layer deposition) from precursors, and which is based on at least one inorganic compound compatible with the adhesive, a metallic reactive sublayer (9) capable of reacting with at least one of these precursors being inserted beneath and in contact with this adhesion-promoter layer, at least one dielectric intermediate layer (8) transparent to the emitted light being placed between the external electrode and the reactive sublayer in order to form, with said external electrode and said reactive sublayer, a resonant cavity.

14 Claims, 3 Drawing Sheets

ELECTROLUMINESCENT DISPLAY, ILLUMINATION OR INDICATING DEVICE, AND ITS FABRICATION PROCESS

FIELD OF THE INVENTION

The present invention relates to an electronic display, illumination or signage device with electroluminescent unit(s) comprising at least two electrodes between which is interposed a light-emitting structure, and to a process for fabricating this device. The invention is generally applicable to active- or passive-matrix devices such as microdisplays or microscreens, by way of nonlimiting example.

BACKGROUND OF THE INVENTION

As is known, electroluminescent-unit display devices, such as for example those using organic light-emitting diodes (OLEDs), comprise, deposited on a semiconductor substrate:

- a luminous emission region formed by a light-emitting structure that comprises at least one organic film and which is interposed between two, one internal and one external, electrodes at least one of which is transparent or semitransparent to the emitted light, the external electrode being thin or relatively thick depending, respectively, on whether emission is to be via the external face of this region or through the substrate; and
- an electrical contact region that is generally arranged adjacent this emission region and that comprises at least one region of contact with the internal electrode and one region of contact with the external electrode, each region possibly being physically formed from a plurality of connections so as to minimize the access resistances.

The encapsulation of OLED units is a critical subject and has been the cause of much research. These units are usually protected from moisture and from oxygen in the ambient air in two different ways:

- either by a protective cap, for example made of glass, molded so as to have a peripheral edge that protrudes toward the interior and bonded only by this edge to the periphery of the emission region of the device, so that the pressure involved in assembly does not alter the OLED stack;
- or by one or more thin encapsulation layer(s) deposited on the emission region and typically comprising organic and inorganic materials in alternation so as meet the required permeability specifications.

One major drawback of the aforementioned first method of encapsulation resides, on the one hand, in the need to shape the protruding edge of this cap during the molding and, on the other hand, in the reduced area of the bonding interface obtained, which is not always able to guarantee an effective, long-lasting encapsulation.

Concerning the aforementioned second method of encapsulation, it is known, for OLED units emitting via the external (i.e. top) face, to deposit on the external electrode a thin capping layer that is transparent to visible light, and which is generally made of a dielectric having a refractive index higher than 1.8 so as to extract photons from the OLED unit. This capping layer must furthermore be deposited using a "soft" method (i.e. using a reduced temperature and a very low-energy bombardment in the presence of few oxidizing species and little water) such as vacuum evaporation, so as not to alter the electro-optical properties of the underlying organic semiconductors.

The capping layers thus deposited have the drawback of being insufficiently dense and of not being "conformal" enough (i.e. of not satisfactorily following the micro- or nano-reliefs of the surfaces that they cover), which reduces the effectiveness of the encapsulation.

Document US-A-2002/0003403 provides an OLED device having two encapsulation layers superposed on the emission region and respectively made of a layer of dielectric oxide, for example deposited using ALD (atomic layer deposition), and a polymer layer, for example made of parylene. Mention may also be made of documents US-A-2007/0099356 and US-A-2007/0275181 that teach the use of the ALD technique for depositing an encapsulation layer on electroluminescent units.

These ALD deposited encapsulation layers have the advantage of being "conformal" whilst having a high density, which affords them relatively satisfactory barrier properties with respect to ambient moisture and oxygen. Nevertheless, one drawback of these ALD deposited layers lies in the use of ALD deposition precursors that contain oxidizers and water, which are liable to alter the characteristics of the underlying OLED unit. The precursors are all the more reactive since the ALD deposition is carried out at low temperature.

SUMMARY OF THE INVENTION

One aim of the present invention is to provide an electronic display, illumination or signage device comprising a substrate coated on at least one of its faces with an electroluminescent unit comprising at least two electrodes, one internal electrode and one external electrode, between which is interposed a light-emitting structure, at least one of these electrodes being transparent to the emitted light, a protective cap being joined to the unit by way of an adhesive that covers a assembly face of the cap, this device allowing the drawbacks mentioned above in relation to the two aforementioned methods of encapsulation to be alleviated.

For this purpose, a device according to the invention is such that this adhesive also covers an adhesion promoting layer that surmounts the unit, said layer being deposited using a precursors based ALD deposition, and which adhesion promoting layer is based on at least one inorganic compound compatible with the adhesive, a reactive metal sublayer that is able to react with at least one of these precursors being interposed beneath and in contact with this adhesion promoting layer, at least one dielectric intermediate layer that is transparent to the emitted light being placed between the external electrode and said reactive sublayer so as to form, with the external electrode and said reactive sublayer, a resonant cavity.

It is noted that this multilayer external electrode/intermediate layer(s)/reactive metal sublayer stack thus allows the creation of a resonant cavity and more particularly a Bragg mirror, allowing the pass band of the emitted light to be substantially widened in comparison to the relatively narrow pass band characteristic of devices without such an intermediate layer between the external electrode and the metal layer.

It is also noted that this synergy between the reactive sublayer and the adhesion promoting layer ensures that the underlying layers of the unit are protected during the ALD deposition and that the adhesion promoting layer conforms to the reliefs of the surfaces that it covers whilst being stable and transparent to the light emitted by the unit. This reactive sublayer, which is interposed between the external electrode and the adhesion promoting layer, interacts with the latter so that its ALD deposition is without deleterious consequences for the external electrode and the components of the underlying emitting structure.

It is furthermore noted that combining the reactive sublayer and the dense and "conformal" adhesion promoting layer provides a clearly improved encapsulation quality, in comparison to protective caps bonded only on their periphery around the electroluminescent unit, because this combination makes it possible to press bond a protective cap over the entire area of its assembly face and of the unit opposite it, without damaging the various underlying components, because of the density of this layer combined with the protection provided by the reactive sublayer. This results in improved impermeability to exterior oxygen and to exterior moisture.

According to another feature of the invention, said or each intermediate layer is based on at least one dielectric compound preferably chosen from the group consisting of compounds having the formulae $SiO_x$, ZnSe, ZnO or $Sb_2O_3$ and transparent conductive oxides (TCOs) and especially indium tin oxides, said layer has a thickness of between 5 nm and 35 nm and may advantageously be deposited using a vacuum evaporation technique.

According to another feature of the invention, said adhesive may cover all of said assembly face of the cap, and advantageously this face is substantially flat.

It is noted that applying the adhesion promoting layer over substantially the entire bonding interface in this way makes the subsequent bonding operation easier because it is not necessary to selectively deposit this layer on the bonding interface, which is thus optimal.

Consequently, the operation of molding the cap so as to give it a peripheral edge that protrudes toward the interior is no longer required, by virtue of the present invention, which enables the use of a cap that is entirely flat on both its faces.

Preferably, the inorganic compound of the adhesion promoting layer is chosen from the group consisting of aluminum oxides, silicon oxides (for example having the formula $SiO_2$), zinc oxides having the formula (ZnO) and silicon nitrides having the formula ($Si_xN_y$).

By way of preference also, said reactive sublayer is made of at least one metallic element such as aluminum or calcium, and has a thickness of 10 nm or less.

As for the adhesion promoting layer, this may advantageously have a thickness of between 10 nm and 100 nm, in particular depending on whether it is desired to enhance the color (i.e. the luminance and radiance) or the luminous efficiency obtained, especially for an external electrode material and thickness and for defined emission colors.

Preferably, said adhesion promoting layer has a thickness of between 20 nm and 80 nm, and said reactive sublayer has a thickness of between 1 nm and 10 nm.

Advantageously, said adhesion promoting layer is made of an aluminum oxide having the formula $Al_2O_3$, and said reactive sublayer may, in this case, be made of aluminum.

According to another feature of the invention, the external electrode may be made of at least one metal that is transparent or semitransparent to the emitted light, preferably silver, aluminum or samarium.

Advantageously, said adhesive used in the press assembly of the protective cap to the electroluminescent unit is chosen to be curable by UV radiation, such as acrylate or epoxy adhesives, and this cap is chosen to be transparent to this radiation.

It is noted that said adhesion promoting layer improves the bond between this adhesive and both the cap and the underlying layers of the electroluminescent unit and that it is chosen to be compatible especially with acrylate or epoxy adhesives and with the components of these underlying layers.

According to another feature of the invention, the device may have no organic encapsulation layer (e.g. a polymer layer such as that disclosed in the aforementioned document US-A-2002/0003403) surmounting the external electrode, except for the layer of adhesive.

According to another feature of the invention, said unit may comprise organic light-emitting diodes (OLEDs), it being specified that any other electroluminescent component could be used.

Generally, the substrate of the device of the invention is a semiconductor, preferably being silicon, and said sheet is made of a material that is transparent to the light emitted by the electroluminescent unit, such as glass or a plastic.

In the particular case of a display device comprising a color microdisplay, it is noted that this protective sheet may be provided with optical color filters, or color changing means, on its assembly face, such that these filters or these means are placed facing corresponding color dots of each of the pixels of the microdisplay.

A process for fabricating, according to the invention, a device such as defined above comprises the following steps:

a) depositing on said external electrode, for example by vacuum evaporation, at least one intermediate layer that is transparent to the light emitted by the electroluminescent unit and that is based on at least one dielectric compound preferably chosen from the group consisting of compounds having the formulae $SiO_x$, ZnSe, ZnO or $Sb_2O_3$ and transparent conductive oxides and especially indium tin oxides, this intermediate layer being intended to form a resonant cavity with this external electrode and the reactive sublayer of step b);

b) depositing on the intermediate layer a reactive sublayer made of at least one metal such as aluminum or calcium;

c) depositing, using ALD, an adhesion promoting layer based on an inorganic compound compatible with the adhesive and preferably chosen from the group consisting of aluminum oxides, silicon oxides, zinc oxides, and silicon nitrides, such that the reactive sublayer reacts with at least one precursor of this deposition so as to protect the underlying layers of the unit from being affected by the ALD deposition and so that the adhesion promoting layer conforms to the reliefs of the surfaces that it covers, whilst being stable and transparent to the emitted light;

d) applying the adhesive to the adhesion promoting layer and/or to said assembly face of the protective cap, so that this adhesive covers substantially all of this external layer and of this substantially flat assembly face; and then e) bonding the cap to the unit coated with this adhesion promoting layer, for example via UV curing of this adhesive.

It is noted that this ALD deposition may be implemented at a low temperature and that it makes it possible to obtain a high density layer of greatly reduced permeability which follows as closely as possible the micro- or nano-reliefs of the surfaces opposite it, and that this ALD technique should not be confused with CVD (chemical vapor deposition) or evaporation methods, those being "non-conformal" methods which cannot be used to deposit the adhesion promoting layer according to the invention.

It is also noted that this adhesion promoting layer is chosen to be sufficiently impermeable that the solvents in the adhesive are prevented from attacking the underlying layers and any filters or color changing means optionally provided on the cap.

BRIEF DESCRIPTION OF THE DRAWINGS

Other advantages, features and details of the invention will become clear from the rest of the description that follows, with reference to the appended drawings that are given solely by way of example and in which.

DETAILED DESCRIPTION OF THE INVENTION

Figure 1:
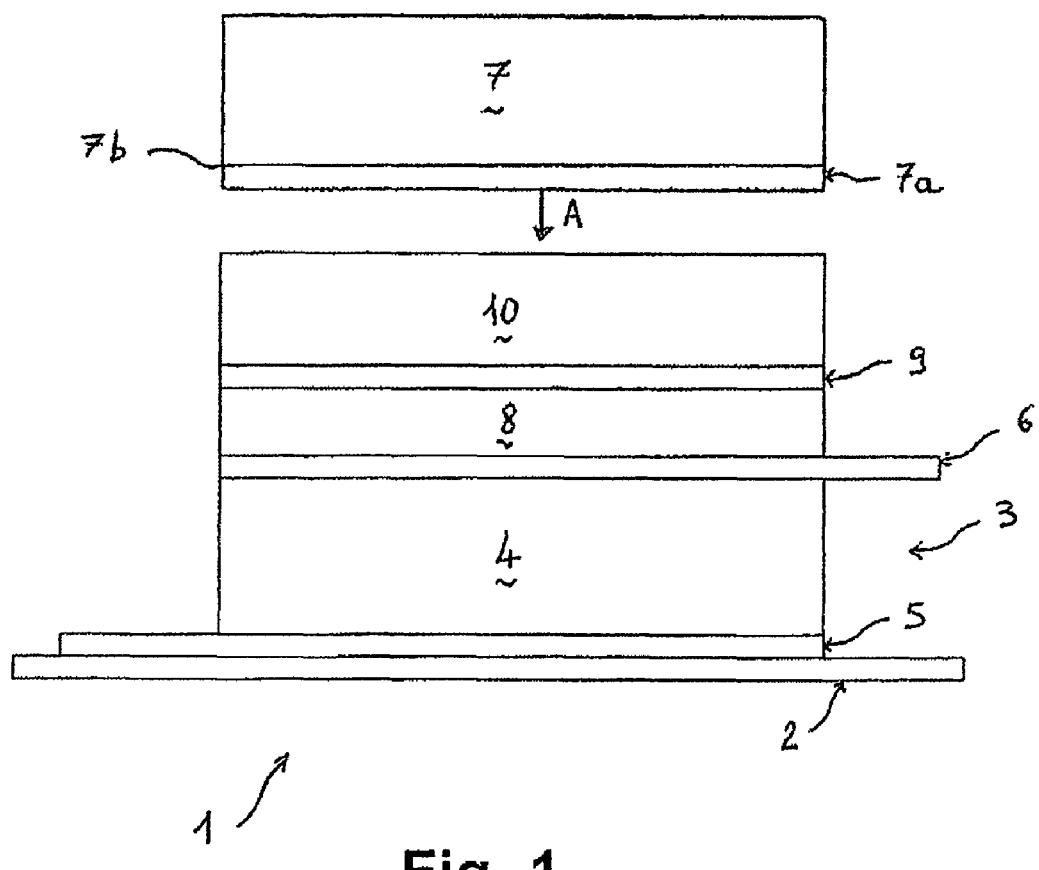
FIG. 1 is an exploded, schematic, cross-sectional view of an electroluminescent unit and of a protective sheet intended, after bonding, to form an electronic device according to the invention.
Figure 2:
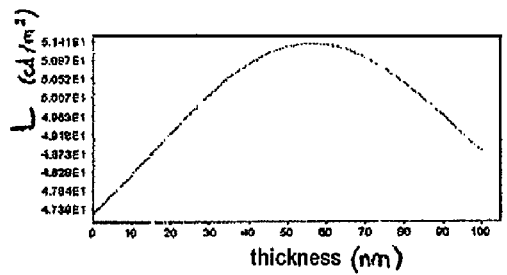
FIGS. 2 to 6 are graphs illustrating the variation, as a function of the thickness of the external adhesion promoting layer, in a first embodiment of a device according to the invention, of the luminance L, the radiance Me, the CIE color coordinate x, the CIE color coordinate y and the luminous efficiency K, respectively.
Figure 3:
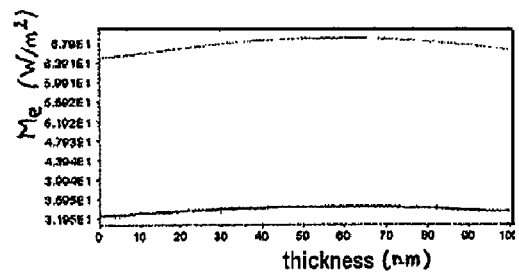
Figure 4:
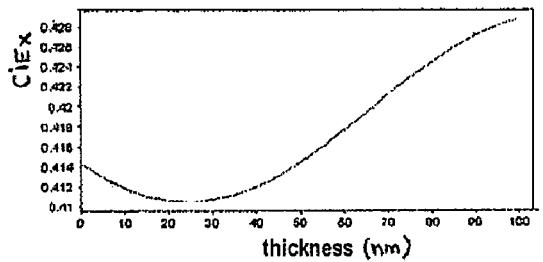
Figure 5:
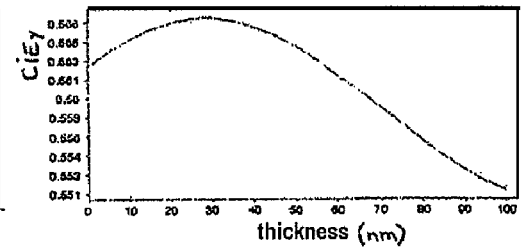
Figure 6:
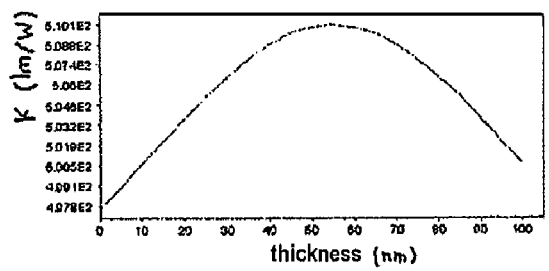
Figure 7:
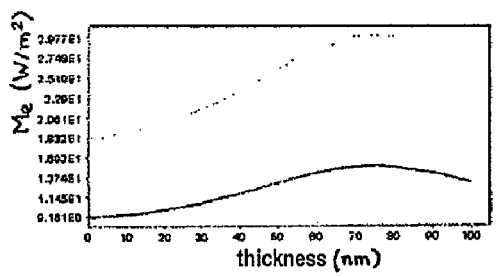
FIGS. 7 to 11 are graphs illustrating the variation, as a function of the thickness of the external adhesion promoting layer, in a second embodiment of a device according to the invention, of the radiance Me, the luminance L, the CIE color coordinate x, the CIE color coordinate y and the luminous efficiency K, respectively.
Figure 8:
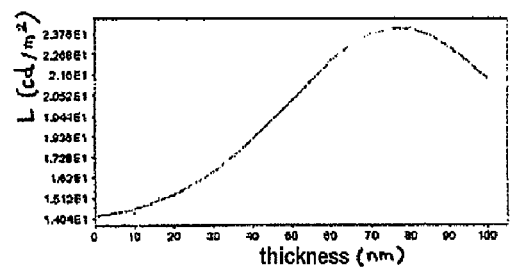
Figure 9:
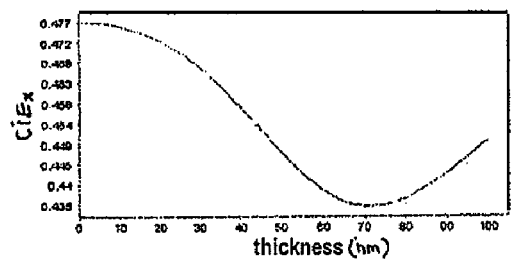
Figure 10:
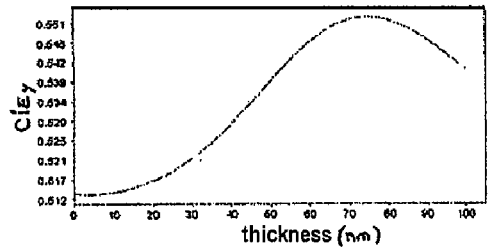
Figure 11:
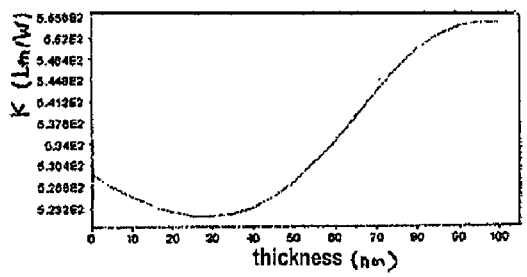

The electronic display device 1 illustrated in FIG. 1 is for example an OLED device, comprising in a known way a substrate 2 typically made of silicon, coated with an electroluminescent unit 3 comprising a light-emitting structure 4 interposed between two electrodes, one internal electrode 5 and one external electrode 6, at least one of which (in this example the external electrode 6) is transparent or semitransparent to the light emitted by the structure 4 so as to transmit the emitted light toward the exterior of the device 1. The (semi) transparent external electrode 6 is preferably made of a metal such as silver, aluminum, or samarium, for the transparency properties of these metals in the visible range and for their electrical conductivity at small thicknesses (the thickness of the external electrode 6 is for example between 10 nm and 30 nm).

The OLED emitting structure is for example made of a multilayer stack of organic films which is designed to transfer electrons and holes from the electrodes 5 and 6 and which electrons and holes recombine to generate excitons and therefore the emission of light.

As illustrated in FIG. 1, this electroluminescent unit 3 is secured to a protective cap 7, for example made of glass or plastic, for its encapsulation, using an adhesive, via a multilayer stack of thin films 8, 9 and 10 deposited in succession on the external electrode 6. It should be noted that, in order to make the drawing clearer, the respective thicknesses and lengths of the various components and layers 2 to 10 illustrated in FIG. 1 are in no way to scale in the plane of the section.

The adhesive 7a used is preferably curable using UV radiation (e.g. a one- or two-component acrylate or epoxy adhesive), the protective cap 7 being, in this case, chosen to be transparent to this radiation. This adhesive is applied in a way known per se, in an uncured state, to all of the assembly face 7b of the cap 7 and/or of the electroluminescent unit 3 surmounted by the aforementioned multilayer stack, then the cap 7 is applied by pressing on the adhesive-coated assembly interface (see arrow A in FIG. 1).

According to the invention, this multilayer stack comprises in succession:
  optionally, a first intermediate capping layer 8 that is transparent to the light emitted by the structure 4 and that is deposited on the external electrode 6 using a "soft" method, for example vacuum evaporation, this intermediate layer 8 being based on a dielectric compound, for example of the indium tin oxide type, or else of the type having the formula $SiO_x$, ZnSe, ZnO, $Sb_2O_3$;
  a reactive metal sublayer 9, for example made of aluminum or calcium, that is able to react with the precursors of the ALD deposition of the following layer 10 with which it is in contact so as protect the underlying layers from being affected by the deposition of this layer; and
  an external, ALD deposited, adhesion promoting layer 10 made of an inorganic compound such as aluminum oxide, silicon oxide, zinc oxide or silicon nitride, such that this external layer 10 conforms to reliefs in the surfaces that it covers whilst being sufficiently dense and transparent to the emitted light.

Preferably, the intermediate layer 8 is made of $SiO_x$ the refractive index of which varies from 2.6 to 2.4 in the visible and which evaporates easily, without affecting the underlying layers. As for the reactive sublayer 9, this may advantageously be made of aluminum that reacts with the precursors of the ALD deposition of the layer 10 so as to form a stable and transparent oxide, which layer 10 is then based on $Al_2O_3$ and forms a dense, conformal layer having a refractive index of 1.6 in the visible.

It is noted that the thickness of the various layers 8 to 10 may be modulated in order to optimize the luminous extraction from the device 1. In particular, the thickness of the reactive metal sublayer 9 will possibly be sufficiently small that the whole of this sublayer 9 reacts with the precursors of the ALD deposition, or it may be thicker and then form some sort of double capping layer.

Preferably, use is made of a reactive sublayer 9 that reacts completely with these precursors and, in order to limit transmission losses, of an intermediate capping layer 8 having a thickness of between 5 nm and 30 nm so as to limit the impact of the ALD deposition on the underlying layers.

Display devices 1 according to a first embodiment of the invention were fabricated and tested, and their main optical and colorimetric parameters were evaluated in relation to the varying thickness of the external layer 10, as illustrated in FIGS. 2 to 6. In this first embodiment, relating to diodes emitting in the green:
  the external electrode 7 is made of silver and has a thickness of 15 nm;
  the intermediate capping layer 8 is made of $SiO_x$ and has a thickness of 30 nm;
  the reactive sublayer 9 is made of aluminum and has a thickness of 2 nm; and
  the external, ALD deposited, layer 10 is made of $Al_2O_3$ and has a thickness that varies.

It is clear from FIGS. 2 to 6 that the maximum radiance and luminance are located between 50 nm and 60 nm thickness for the external layer 10. As for the range of thicknesses of this layer 10 for which the CIE x is the lowest and the CIE y the highest, this is between 20 nm and 30 nm. Thus, depending on whether it is the color or the luminous efficiency that is to be enhanced, it is possible to advantageously opt for one or other of these two ranges of thicknesses when depositing this layer 10.

Display devices 1 according to a second embodiment of the invention were fabricated and tested, and the same optical and colorimetric parameters thereof were evaluated as a function of the thickness of the layer 10, as illustrated in FIGS. 7 to 11. In this second embodiment, again relating to diodes emitting in the green:
  the external electrode 7 is also made of silver and again has a thickness of 15 nm;
  the intermediate capping layer 8 has a zero thickness (this layer 8 therefore being absent, unlike in the first example);

the reactive sublayer 9 is made of aluminum and has a thickness of 7 nm (i.e. 5 nm more than in the first example); and the external, ALD deposited, layer 10 is also made of $Al_2O_3$ and has a thickness that varies.

It is clear from FIGS. 7 to 11 that the optimum thickness of this external layer 10, both in terms of luminance and in terms of CIE coordinates, is between 70 nm and 80 nm.

The invention claimed is:

1. An electronic display, illumination or signage device comprising a substrate coated on at least one of its faces with an electroluminescent unit comprising at least two electrodes, one internal electrode and one external electrode, between which is interposed a light-emitting structure, at least one of these electrodes being transparent to the emitted light, a protective cap being joined to the unit by way of an adhesive that covers a assembly face of the cap, characterized in that this adhesive also covers an adhesion promoting layer that surmounts the unit, said layer being deposited from precursors using atomic layer deposition (ALD), and which adhesion promoting layer is based on at least one inorganic compound compatible with the adhesive, a reactive metal sublayer that is able to react with at least one of these precursors being interposed beneath and in contact with this adhesion promoting layer, at least one dielectric intermediate layer that is transparent to the emitted light being placed between the external electrode and said reactive sublayer so as to form, with the external electrode and said reactive sublayer, a resonant cavity.

2. The device as claimed in claim 1, characterized in that said intermediate layer is based on at least one dielectric compound chosen from the group consisting of compounds having the formulae $SiO_x$, ZnSe, ZnO or $Sb_2O_3$ and transparent conductive oxides (TCOs), especially indium tin oxides.

3. The device as claimed in claim 1, characterized in that said intermediate layer is deposited using a vacuum evaporation technique and has a thickness of between 5 nm and 35 nm.

4. The device as claimed in claim 1, characterized in that said adhesive covers all of said assembly face of the cap, which face is substantially flat.

5. The device as claimed in claim 1, characterized in that said inorganic compound of said adhesion promoting layer is chosen from the group consisting of aluminum oxides, silicon oxides, zinc oxides and silicon nitrides.

6. The device as claimed in claim 1, characterized in that said reactive sublayer is made of at least one metallic element such as aluminum or calcium, and has a thickness of 10 nm or less.

7. The device as claimed in claim 1, characterized in that said adhesion promoting layer has a thickness of between 10 nm and 100 nm.

8. The device as claimed in claim 7, characterized in that said adhesion promoting layer has a thickness of between 20 nm and 80 nm, and in that said reactive sublayer has a thickness of between 1 nm and 10 nm.

9. The device as claimed in claim 1, characterized in that said adhesion promoting layer is made of an aluminum oxide having the formula $Al_2O_3$, and in that said reactive sublayer is made of aluminum.

10. The device as claimed in claim 1, characterized in that the external electrode is made of at least one metal that is (semi)transparent to the emitted light, preferably silver, aluminum or samarium.

11. The device as claimed in claim 1, characterized in that said adhesive is chosen to be curable by UV radiation, such as acrylate or epoxy adhesives, said protective cap being chosen to be transparent to this radiation.

12. The device as claimed in claim 1, characterized in that said electroluminescent unit comprises organic light-emitting diodes (OLEDs).

13. The device as claimed in claim 1, characterized in that said substrate is a semiconductor, preferably silicon, and in that said protective cap is transparent to the light emitted by said electroluminescent unit and is made of glass or plastic.

14. A process for fabricating a device as claimed in claim 1, comprising the following steps:
a) depositing on said external electrode, for example by vacuum evaporation, at least one intermediate layer that is transparent to the light emitted by the electroluminescent unit and that is based on at least one dielectric compound preferably chosen from the group consisting of compounds having the formulae $SiO_x$, ZnSe, ZnO or $Sb_2O_3$ and transparent conductive oxides (TCOs), especially indium tin oxides, this intermediate layer being intended to form a resonant cavity with this external electrode and the reactive sublayer of step b);
b) depositing on said intermediate layer a reactive sublayer made of at least one metal such as aluminum or calcium;
c) depositing, using ALD, an adhesion promoting layer based on an inorganic compound compatible with the adhesive and chosen from the group consisting of aluminum oxides, silicon oxides, zinc oxides, and silicon nitrides, such that the reactive sublayer deposited in step b) reacts with at least one precursor of this deposition so as to protect the underlying layers of the unit from being affected by this ALD deposition and so that this external layer conforms to the reliefs of the surfaces that it covers, whilst being stable and transparent to the emitted light;
d) applying the adhesive to the adhesion promoting layer and/or to said assembly face of the protective cap, so that this adhesive covers substantially all of this external layer and of this assembly face; and then
e) bonding the cap to the unit coated with this adhesion promoting layer, for example via UV curing of this adhesive.

* * * * *